(12) United States Patent
Hong et al.

(10) Patent No.: US 6,552,839 B1
(45) Date of Patent: Apr. 22, 2003

(54) OPTICAL SWITCH

(75) Inventors: Yoon Shik Hong, Sungnam (KR); Joon Seok Kang, Pusan (KR); Sang Kee Yoon, Suwon (KR); Sung Cheon Jung, Seoul (KR); Jung Hyun Lee, Suwon (KR); Hyun Kee Lee, Suwon (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/104,692

(22) Filed: Mar. 21, 2002

(30) Foreign Application Priority Data

Dec. 7, 2001 (KR) .................................... 2001-0077186

(51) Int. Cl.⁷ .................. G02B 26/00; G02B 26/08; H02N 1/00
(52) U.S. Cl. .................. 359/290; 359/224; 310/309
(58) Field of Search .................. 359/290, 291, 359/298, 292, 214, 224; 310/90, 309, 36; 73/504.02, 505, 504.12

(56) References Cited

U.S. PATENT DOCUMENTS 6,229,640 B1  5/2001  Zhang et al. ................ 359/290

2002/0130586 A1 * 9/2002 Mao et al. ................ 310/309

FOREIGN PATENT DOCUMENTS

WO    WO 98/12589    3/1998

* cited by examiner

Primary Examiner—Georgia Epps
Assistant Examiner—William Choi
(74) Attorney, Agent, or Firm—Darby & Darby

(57) ABSTRACT

Disclosed herein is an optical switch. The optical switch includes an electrostatic actuator and a substrate. The electrostatic actuator includes an electrostatic actuator, the electrostatic actuator comprising, a reciprocating mass located in the center of the electrostatic actuator, first rotating axes located symmetrically at the left and right sides of the reciprocating mass, first rotating masses rotatably connected to the first rotating axes, first rotating springs for supporting the first rotating masses, linear springs connected to the first rotating masses, second rotating masses connected to the linear springs, second rotating springs for supporting the second rotating masses, second rotating axes connected to the second rotating masses, structural anchors at the side ends of the actuator, drive electrodes, and a micro mirror movable by the same displacement as the reciprocating mass.

5 Claims, 4 Drawing Sheets

OPTICAL SWITCH

BACKGROUND OF THE INVENTION

1. Field of the Invention

The present invention relates to an optical switch for optical communication, and more particularly to an optical switch employing microelectromechanical systems technology.

2. Description of the Prior Art

In general, MEMS (microelectromechanical systems) technology has strong advantages in developing inexpensive, high performance, sub micro devices, so studies for applying MEMS technology to inertia sensors, pressure sensors, biomedical devices, various parts for optical communication, etc. are actively carried out. An optical switch employing MEMS technology is one of these applications, and is utilized to alter the paths of optical signals transmitted via optical fibers using a precise micro mirror situated over a substrate and fabricated through a fine machining technique.

MEMS optical switches that have been developed up to now include a two-dimensional (2D) optical switch operated parallel to a substrate and a three-dimensional (3D) optical switch operated perpendicular as well as parallel to the substrate.

The 3D MEMS optical switch allows the number of micro mirrors integrated in a single chip to be easily increased, so this switch is applicable to a DWDM (Double Wavelength Division Multiplexing) system for distributing multi-channel optical signals.

The 2D MEMS optical switch is capable of not only distributing multi-channel optical signals but also minimizing free space between optical fibers in which a micro mirror is situated, when it is applied to optical switches formed in the 1×2 and 2×2 matrices. Accordingly, the 2D MEMS optical switch can allow an inexpensive system to have good optical performance. Additionally, the MEMS optical switch allows a sub micro actuator to have good mechanical characteristics, thereby providing high speed response.

In particular, of the 2D MEMS optical switches actuated parallel to the substrate, studies for a 2×2 optical switch that alters optical paths by moving its micro mirror forward or backward between four optical fibers disposed on an optical paths have been actively performed.

An example of a conventional 2×2 optical switch is disclosed in PCT publication WO 98/12589 issued to Anmelder et al. and entitled "A Fiber Optical Circuit Switch and a Process for Its Production", in which the optical switch is fabricated in the form of a sandwich wafer having isolation films formed between a substrate and a conductive device layer.

The optical switch disclosed in the publication is characterized by the provision of a metal-deposited silicon micro mirror that is connected to a bi-directional comb drive actuator manufactured to be driven in both forward and backward directions. In accordance with this publication, optical paths are changed while the micro mirror is moved into or removed from the optical paths by the operation of the bi-directional comb drive actuator. However, the actuator is disadvantageous in that driving power is continuously consumed while the actuator is forwardly or backwardly driven in order to remain stationary state.

Another example of the conventional art is disclosed in U.S. Pat. No. 6,229,640 B1 issued to Nan Zhang et al. and entitled "Microelectromechanical Optical Switch and Method of Manufacture Thereof", which is characterized by the provision of a single comb actuator.

In this patent, a micro mirror initially moved into optical paths can be removed from the optical paths by the operation of the actuator, and can be again moved into the optical paths in such a way that the actuator is stopped and, as a result, the micro mirror returns to its original position by the restoring force of a beam structure connecting the actuator to a substrate. Consequently, the actuator does not consume driving power in the forward movement state, but still consumes driving force in the backward movement state.

Therefore, the optical switch of this patent is disadvantageous in that power is wastefully consumed by the actuator, since the micro mirror is stopped by the application of a driving force corresponding to a restoring force in the direction opposite to the moving direction of the micro mirror while the mirror is maintained in at least one of forward and backward movement states in which the micro mirror is moved into and out of the optical paths, respectively.

SUMMARY OF THE INVENTION

Accordingly, the present invention has been made keeping in mind the above problems occurring in the prior art, and an object of the present invention is to provide an optical switch, in which its actuator is designed to move a micro mirror from a forward position to a backward position and vice versa through a single driving pulse signal, thereby minimizing the power consumption of the actuator.

In order to accomplish the above object, the present invention provides an optical switch, comprising: an electrostatic actuator, the electrostatic actuator comprising a reciprocating mass located in the center of the electrostatic actuator, first rotating axes located symmetrically at the left and right sides of the reciprocating mass, first rotating masses rotatably connected to the first rotating axes, first rotating springs for supporting the first rotating masses, linear springs connected to the first rotating masses for supporting the first rotating masses together with the rotating springs, second rotating masses connected to the linear springs to restrict their displacement in one direction, second rotating springs for supporting the second rotating masses with first ends of the second rotating masses connected thereto, second rotating axes connected to the second rotating masses, structural anchors integrated with the second rotating axes and positioned at the side ends of the actuator, drive electrodes, and a micro mirror movable by the same displacement as the reciprocating mass, wherein the electrostatic actuator having two structural stability positions for the reciprocating mass and the left and right rotating masses; and a substrate.

Preferably, the drive electrode consists of a forward drive electrode and a backward drive electrode.

Preferably, a both-sides etched silicon structure is used on the substrate, as a device layer.

Preferably, the actuator remains stopped without being driven at the two stability positions if a force is not applied.

Preferably, the silicon structure is manufactured by the steps of: machining a silicon substrate; etching one side of the silicon substrate formed at the machining step by using a first etching mask; bonding a glass plate to the side etched at the first etching step; polishing a side of the silicon substrate bonded with the glass plate at the bonding step to reduce the thickness of the silicon substrate; and etching the side of the silicon substrate reduced in thickness at the polishing step by using a second etching mask.

BRIEF DESCRIPTION OF THE DRAWINGS

The above and other objects, features and other advantages of the present invention will be more clearly understood from the following detailed description taken-in conjunction with the accompanying drawings, in which.

DESCRIPTION OF THE PREFERRED EMBODIMENTS

Hereinafter, a preferred embodiment of the present invention is described in detail with reference to the appended drawings.

The present invention provides a MEMS optical switch for changing an optical path using an electrostatic actuator having a micro mirror connected to side of a vertical structure formed floating over a bottom substrate by fine machining.

Figure 1:
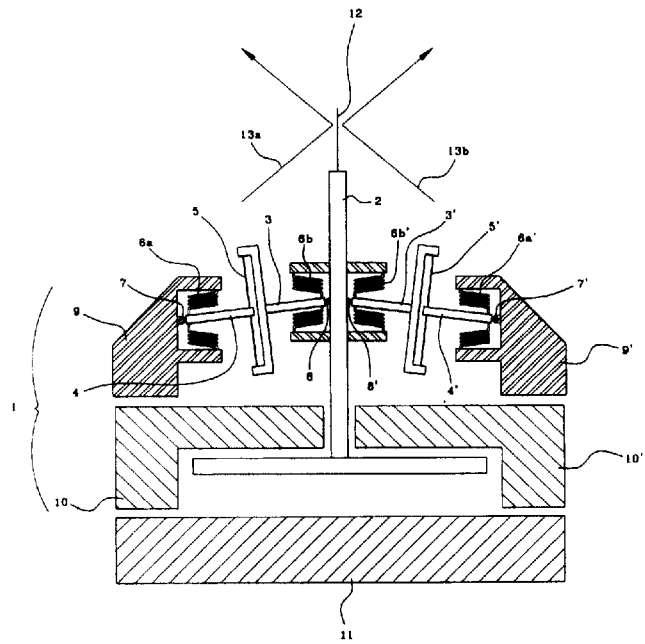
FIG. 1 is a view showing an optical switch in a forward position according to an embodiment of the present invention in which optical paths are altered by a micro mirror.

FIG. 1 is a view showing an optical switch in a forward position according to an embodiment of the present invention.

As shown in FIG. 1, the optical switch of this embodiment is generally comprised of an electrostatic actuator 1 and a substrate (not shown). The electrostatic actuator 1 includes a reciprocating mass 2, first left and right rotating masses 3 and 3', second left and right rotating masses 4 and 4', left and right linear springs 5 and 5', first left and right rotating spring 6b and 6b', second left and right rotating spring 6a and 6a', first left and right rotating axes 8 and 8', second left and right rotating axes 7 and 7', left and right structural anchor 9 and 9', left and right forward drive electrodes 10 and 10', a backward drive electrode 11, and a micro mirror 12 connected to the top of the reciprocating mass 2. At least one of optical paths 13a and 13b is altered by the micro mirror 12. All elements of the electrostatic actuator 1 except the left and right structural anchor 9 and 9', the left and right forward drive electrodes 10 and 10' and the backward drive electrode 11 are constructed to be suspended over the substrate, so they can be freely moved parallel to the substrate. In addition, the second left and right rotating springs 6a and 6a' connect the suspended elements, which are connected to one another, to the structural anchors 9 and 9' so as to allow the suspended elements to be supported by the structural anchors 9 and 9'.

Figure 2:
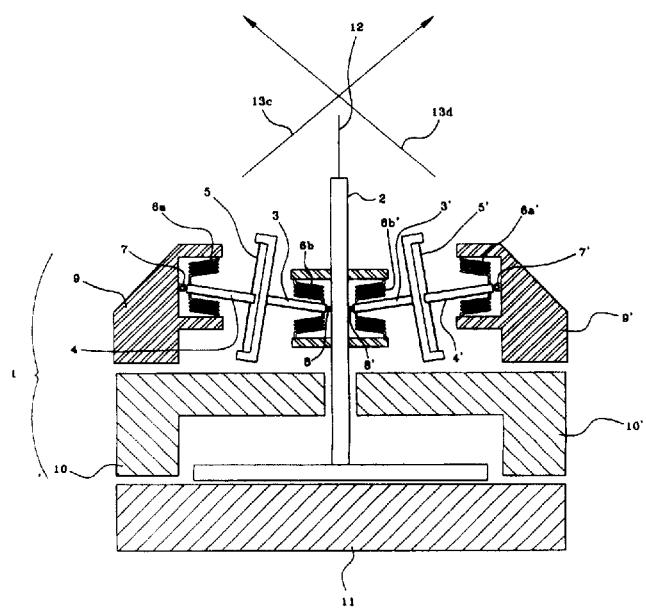
FIG. 2 is a view showing an optical switch in a backward position according to an embodiment of the present invention in which optical paths are not altered by a micro mirror.
Figure 3A:
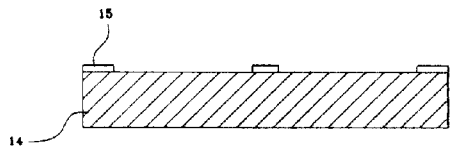
FIGS. 3a to 3d are schematic cross sectional views showing a fine machining process of the substrate of the optical switch.
Figure 3B:
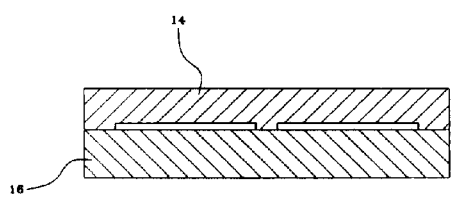
Figure 3C:
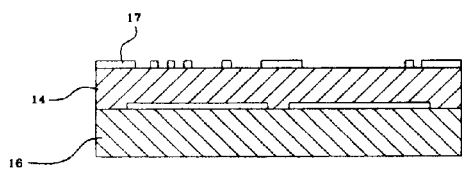
Figure 3D:
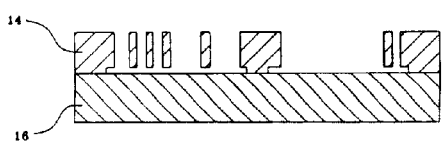

FIG. 2 shows a state in which the actuator 1 is moved to a backward position from an initial forward position. In this state, at least one of optical paths 13c and 13d is maintained without any alteration, unlike the optical paths 13a and 13b of FIG. 1.

The electrostatic actuator of the present invention can carry out latch-up operations to have two structurally stable positions. More particularly, when a backward driving force greater than a threshold value is applied to the electrostatic actuator in an initial forward position in which the reciprocating mass is projected upwardly, the reciprocating mass is moved backward to a backward position and then is stopped in the backward position even though no subsequent driving force is applied.

On the contrary, when a forward driving force is applied to the electrostatic actuator in the backward position, the actuator is moved forward to the initial forward position by the forward driving force greater than the threshold value and then is maintained in the initial forward position even though no force is applied.

The reason why such latch-up operations are carried out can be seen from the configuration of the reciprocating mass and the rotating masses.

Figure 4:
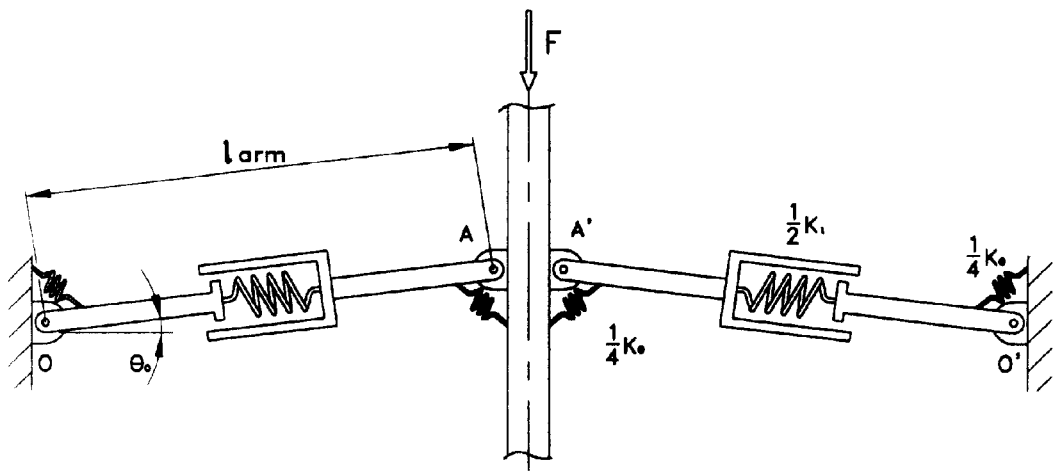
FIG. 4 is a view showing a first stability configuration of a simplified model of the optical switch according to the present invention.

First, the optical switch of FIG. 1 can be simplified as a configuration consisting of the reciprocating mass and the rotating masses, as shown in FIG. 4. FIG. 4 is a schematic view showing the movable elements of the actuator except for the drive electrodes, the optical paths and the micro mirror, where the rotating masses are configured to be symmetrical with respect to the reciprocating mass. Each of the left and right rotating masses includes an upper rotating mass and a lower rotating mass. Linear springs for producing a restoring force against compression deformation are provided between the upper rotating masses and the lower rotating masses. The lower rotating mass has a rotation axis with respect to a fixed coordinate system. In addition, each of the rotating masses is provided with a rotating spring connected to the fixed coordinate system and the reciprocating mass for supporting a corresponding rotating mass.

In FIG. 4, all the springs are in their initial position in which they are not extended or compressed, and the reciprocating mass is in its forward position. An initial angle that each of two arms forms with an axis perpendicular to a driving direction is represented as $\theta_0$, a total linear spring constant is represented as $k_1$, and a rotating spring constant is represented as $k_\theta$.

When it is assumed that the left and right rotating masses are rotated by an angle $\theta$ around points O and O', respectively, by the application of a backward driving force F in the initial position of FIG. 1, elastic energy stored in the linear springs and the rotating springs can be represented as the following equation.

$$U_e = \frac{1}{2}k_\theta\theta^2 + \frac{1}{2}k_l l_{arm}^2[\cos(\theta_0 - \theta) - \cos\theta_0]^2 \quad \text{Equation 1}$$

When the elastic energy $U_e$ is differentiated with respect to angular displacement $\theta$, angular momentum M can be represented as the following equation.

$$M = \frac{\partial U_e}{\partial \theta} = k_\theta\theta + k_l l_{arm}^2[\cos(\theta_0 - \theta) - \cos\theta_0]\sin(\theta_0 - \theta) \quad \text{Equation 2}$$

Accordingly, a backward driving force F required for generating the angular displacement $\theta$ can be calculated by the following equation.

$$F = \frac{M}{l_{arm}} = \frac{k_\theta \theta}{l_{arm}} + k_1 l_{arm}[\cos(\theta_0 - \theta) - \cos\theta_0]\sin(\theta_0 - \theta) \quad \text{Equation 3}$$

Figure 6A:
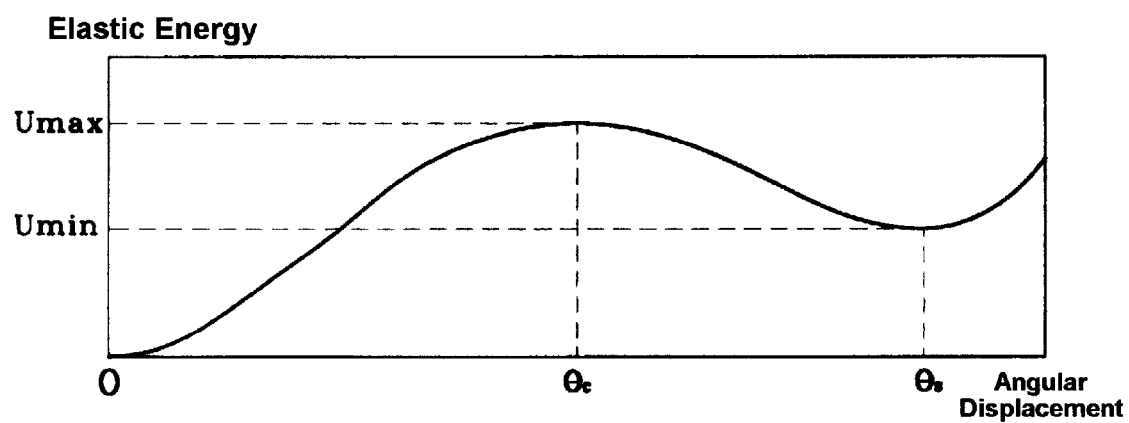
FIGS. 6a and 6b are graphs showing variations of elastic energy and driving force depending on angular displacement.
Figure 6B:
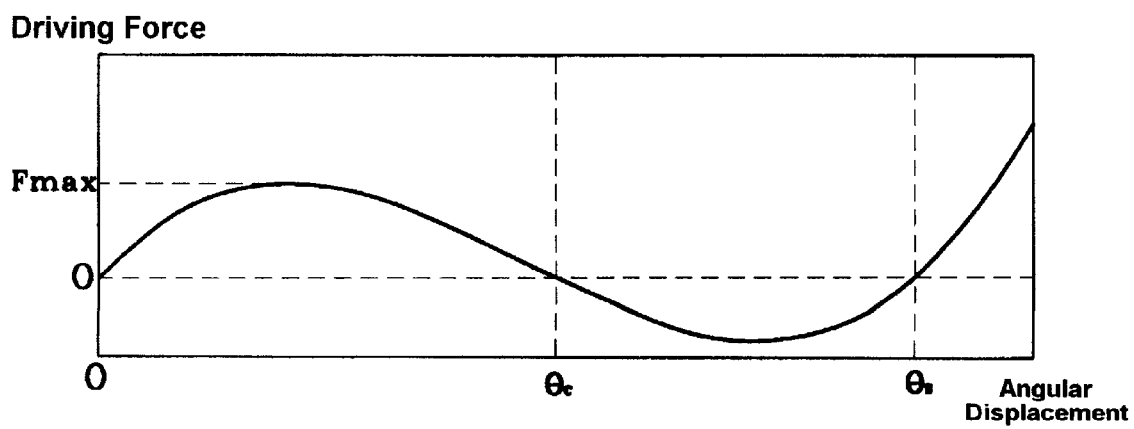

In addition, when the structure shown in FIG. 4 is designed to have two stability positions, the elastic energy and the driving force with respect to the angular displacement are represented as in graphs of FIGS. 6a and 6b.

The structure has the stability positions at angular displacements at which the elastic energy has a local minimum. As shown in FIG. 6a, the stability positions are obtained when the angular displacements are 0 and $\theta_s$. When a driving force greater than Fmax of FIG. 6b is applied, the angular displacement is generated to be greater than $\theta_s$. When the driving force disappears, the angular displacement is maintained at $\theta_s$.

A first stability position- with respect to the reciprocating mass and the left and right rotating masses is obtained when the angular displacement is 0. At that time, the arm structure has an angle of $\theta_0$ with respect to a horizontal axis, as shown in FIG. 4. A second stability position is obtained when the angular displacement is $\theta_s$. At that time, the arm structure has an angle of $\theta_s - \theta_0$ with respect to a horizontal axis, as shown in FIG. 5.

Figure 5:
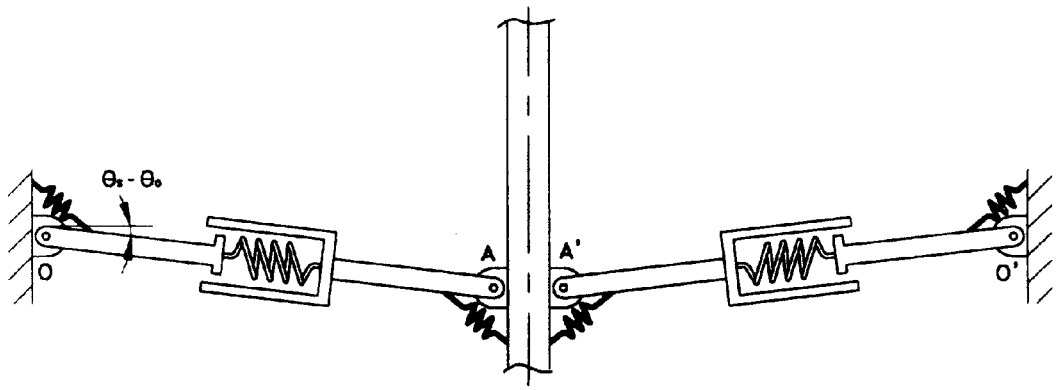
FIG. 5 is a view showing a second stability configuration of a simplified model of the optical switch according to the present invention.

FIG. 5 is a view showing a second stability configuration of a simplified model of the MEMS optical switch according to the present invention.

As described above, the optical switch of the present invention has two structural stability positions within a region in which the electrostatic actuator can be moved parallel to the substrate. Accordingly, the micro mirror can be maintained in a stationary state at these points without any driving force.

In other words, at the two stability positions, if a force is not applied, the actuator remains stopped without being driven. Accordingly, the optical switch of the present invention can minimize power consumption while it is operated.

Another characteristic of the present invention lies in a substrate constituting the optical switch together with the electrostatic actuator.

FIGS. 3a to 3d are schematic cross sectional views showing a fine machining process of the substrate according to the present invention. In these figures, the substrate of the optical switch is shown as a layered structure of a silicon layer 14 and a glass plate 16. A silicon substrate is initially machined into the silicon layer 14. Then, the glass plate 16 is bonded to the surface of the silicon layer 14 etched using a first etching mask 15, and then the surface of the silicon layer 14 opposite to the etched surface of the silicon layer 14 is polished to reduce the thickness of the silicon layer 14.

Subsequently, a second etching is carried out using a second etching mask on the upper side of the silicon layer 14 having a reduced thickness. With a structure completed through the processes described above, micro structures suspended over the substrate can be fabricated without performing an etching process of a sacrifice layer. In other words, in case that a prior etching process of the sacrifice layer is performed, an oxidation film formed between the silicon layers should be finally etched away by fluoric acid solution. Namely, the adherence of the structure elements occurs while the fluoric acid solution is evaporated during the etching process in the solution. However, the present invention can prevent such adherence so that the micro structures are not deformed.

Therefore, according to the present invention, the optical switch is advantageous in that it can be manufactured by a simplified process without performing the etching process of the sacrifice layer using a both-sides etched silicon structure as a device layer.

As described hereinbefore, the optical switch of the present invention employs a manufacturing method of the MEMS optical switch without any sacrifice layer etching, so cost savings, miniaturization and mass production of the optical switch can be realized. In addition, since the electrostatic actuator in the optical switch of the present invention has two structural stability positions within a driving region, a transmission direction of the optical signals can be changed by temporarily applying pulse driving signals to the actuator only during a forward or backward operation of the actuator, resulting in overcoming the problem of high power consumption of the prior MEMS optical switch. Furthermore, the actuator positioned at the stability positions is designed to generate a restoring force so as to allow its return to the stability positions against external disturbance as long as driving signals are not applied, so the position precision of the optical switch can be enhanced.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. An optical switch, comprising:

a substrate, an electrostatic actuator formed over the substrate, said electrostatic actuator comprising, a reciprocating mass located in the center of the electrostatic actuator, first rotating axes located symmetrically at opposite sides of the reciprocating mass, first rotating masses rotatably connected to the first rotating axes, first rotating springs for supporting the first rotating masses, linear springs connected to the first rotating masses for supporting the first rotating masses together with the rotating springs, second rotating masses connected to the linear springs to restrict their displacement in one direction, second rotating springs for supporting the second rotating masses with first ends of the second rotating masses connected thereto, second rotating axes connected to the second rotating masses, structural anchors integrated with the second rotating axes and positioned at sides of the actuator, drive electrodes, and a micro mirror movable by the same displacement as the reciprocating mass, wherein the electrostatic actuator having two structural stability positions for the reciprocating mass and the left and right rotating masses.

2. The optical switch according to claim 1, wherein said drive electrode consists of a forward drive electrode and a backward drive electrode.

3. The optical switch according to claim 1, whereon said substrate, a both-sides etched silicon structure is used as a device layer.

4. The optical switch according to claim 1, wherein said actuator remains/stopped without being driven at the two stability positions if a force is not applied.

5. The optical switch according to claim 3, wherein said silicon structure is manufactured by the steps of:

machining a silicon substrate;

etching one side of the silicon substrate formed at the machining step by using a first etching mask;

bonding a glass plate to the side etched at the first etching step;

polishing a side of the silicon substrate bonded with the glass plate at the bonding step to reduce the thickness of the silicon substrate; and etching the side of the silicon substrate reduced in thickness at the polishing step by using a second etching mask.

* * * * *